United States Patent
Chen

(10) Patent No.: US 11,375,330 B2
(45) Date of Patent: Jun. 28, 2022

(54) METHOD AND DEVICE FOR PROCESSING INFORMATION, TERMINAL DEVICE, AND STORAGE MEDIUM

(71) Applicant: BEIJING XIAOMI MOBILE SOFTWARE CO., LTD., Beijing (CN)

(72) Inventor: Jing Chen, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/787,929

(22) Filed: Feb. 11, 2020

(65) Prior Publication Data

US 2021/0136504 A1    May 6, 2021

(30) Foreign Application Priority Data

Oct. 30, 2019   (CN) .......................... 201911046038.1

(51) Int. Cl.
*H04R 29/00* (2006.01)
*G01R 31/28* (2006.01)
(Continued)

(52) U.S. Cl.
CPC ....... *H04R 29/001* (2013.01); *G01R 31/2825* (2013.01); *G06F 11/3058* (2013.01); *H04R 3/04* (2013.01)

(58) Field of Classification Search
CPC ... H04R 3/00; H04R 3/04; H04R 3/06; H04R 3/08; H04R 3/007; H04R 3/12;
(Continued)

(56) References Cited

U.S. PATENT DOCUMENTS 4,433,295 A * 2/1984 Zaugg .................... G04C 10/04
324/429
2004/0091123 A1   5/2004 Stark et al.
(Continued)

FOREIGN PATENT DOCUMENTS

CN   102571011 A   7/2012
CN   102804598 A   11/2012
(Continued)

OTHER PUBLICATIONS

John Fothergill et al "The Measurement of Very Low Conductivity and Dielectric Loss in XLPE Cables: A Possible Method to Detect Degradation Due to Thermal Aging", IEEE Transaction on Dielectrics and Electrical Insulation, October, pp. 1-10 (Year: 2011).*
(Continued)

*Primary Examiner* — Leshui Zhang
(74) *Attorney, Agent, or Firm* — Arch & Lake LLP

(57) ABSTRACT

A method and device for processing information are provided. The method for processing information includes: determining a current output voltage of a power supply in a terminal device; determining a target parameter of an audio processing circuit in the terminal device according to the current output voltage; and configuring the audio processing circuit for processing an audio signal according to the target parameter. With the embodiments of the present disclosure, an impact of a change of the output voltage of the power supply on output volume of a loudspeaker can be reduced, thereby improving user experience.

5 Claims, 8 Drawing Sheets

(51) Int. Cl.
  *G06F 11/30* (2006.01)
  *H04R 3/04* (2006.01)
(58) Field of Classification Search
  CPC ............ G01R 31/2825; G01R 31/2827; G01R 31/282; G06F 11/3058; G06F 11/3003; G06F 11/3051; G06F 11/3055
  USPC ........... 381/320, 321, 94.1, 94.2, 94.3, 94.8, 381/98–104, 106, 107, 108, 111, 116, 381/117, 120, 121; 700/94; 330/297, 330/123, 127–142
  See application file for complete search history.

(56) References Cited

U.S. PATENT DOCUMENTS

| | | |
|---|---|---|
| 2005/0100179 A1 | 5/2005 | Behboodian et al. |
| 2007/0140513 A1 | 6/2007 | Furge |
| 2008/0117038 A1 | 5/2008 | Stark et al. |
| 2008/0117070 A1 | 5/2008 | Ludwig et al. |
| 2008/0122602 A1 | 5/2008 | Westley et al. |
| 2008/0123870 A1 | 5/2008 | Stark et al. |
| 2010/0322438 A1* | 12/2010 | Siotis ..................... H03G 3/007 381/98 |
| 2012/0008796 A1 | 1/2012 | Furge |
| 2014/0301570 A1* | 10/2014 | Morriss ................... H03F 3/183 381/107 |
| 2018/0206034 A1* | 7/2018 | Serwy .................. H04R 29/001 |

FOREIGN PATENT DOCUMENTS

| | | |
|---|---|---|
| CN | 103414444 A | 11/2013 |
| CN | 104423541 A | 3/2015 |
| CN | 105553434 A | 5/2016 |
| CN | 110022515 A | 7/2019 |
| EP | 1798852 A2 | 6/2007 |

OTHER PUBLICATIONS

Supplementary European Search Report in the European Application No. 20160612.6, dated Aug. 14, 2020, (11p).
First Office Action of the Chinese application No. 201911046038.1, dated Nov. 29, 2021 with English translation, (xp).

* cited by examiner

METHOD AND DEVICE FOR PROCESSING INFORMATION, TERMINAL DEVICE, AND STORAGE MEDIUM

CROSS-REFERENCE TO RELATED APPLICATION

The present application claims priority to Chinese Patent Application No. 201911046038.1, filed on Oct. 30, 2019, the disclosure of which is hereby incorporated by reference in its entirety.

TECHNICAL FIELD

The present disclosure relates to the field of information processing technology, and more particularly to a method and device for processing information, a terminal device, and a storage medium.

BACKGROUND

A loudspeaker, as a device for converting an electrical signal into an acoustic signal, is widely applied in terminal devices, to output sound for the terminal devices, such as a mobile phone, a tablet PC, and a smartwatch. In some environments of, for example, low temperature or low power capacity, the volume of the sound outputted by the terminal device through the loudspeaker drops significantly, which affects user experience.

SUMMARY

The present disclosure provides a method and device for processing information, a terminal device, and a storage medium.

According to a first aspect of the present disclosure, a method for processing information is provided, which may include operations as follows. A current output voltage of a power supply in a terminal device is determined. A target parameter of an audio processing circuit in the terminal device is determined according to the current output voltage. The audio processing circuit for processing an audio signal is configured according to the target parameter.

According to a second aspect of the present disclosure, a terminal device is provided, which may include: a processor; and a memory configured to store a processor-executable instruction. The processor is configured to operations as follows. A current output voltage of a power supply in a terminal device is determined. A target parameter of an audio processing circuit in the terminal device is determined according to the current output voltage. The audio processing circuit for processing an audio signal is configured according to the target parameter.

According to a third aspect of the present disclosure, a storage medium is provided. An instruction in the storage medium, when being executed by a processor of a terminal, enables the terminal to perform the method for processing information in the above first aspect.

It is to be understood that the above general descriptions and the following detailed descriptions are only examples and explanatory, rather than limiting the present disclosure.

BRIEF DESCRIPTION OF THE DRAWINGS

The accompanying drawings, which are incorporated in and constitute a part of the specification, illustrate embodiments consistent with the present disclosure and, along with the description, serve to explain the principles of the present disclosure.

DETAILED DESCRIPTION

Reference will now be made in detail to embodiments of the present disclosure, examples of which are illustrated in the accompanying drawings. The following description refers to the accompanying drawings in which the same numbers in different drawings represent the same or similar elements unless otherwise stated. The implementations set forth in the following description of embodiments do not represent all implementations consistent with the present disclosure. Instead, the disclosed implementations are provided merely as examples of apparatuses and methods consistent with aspects related to the present disclosure and as recited in the appended claims.

The terminology used in the present disclosure is for the purpose of describing particular embodiments only and is not intended to limit the present disclosure. As used in the present disclosure and the appended claims, the singular forms "a," "an," and "the" are intended to include the plural forms as well, unless the context clearly indicates otherwise. It shall also be understood that the term "and/or" used herein is intended to signify and include any or all possible combinations of one or more of the associated listed items.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to a judgment" depending on the context.

Figure 1A:
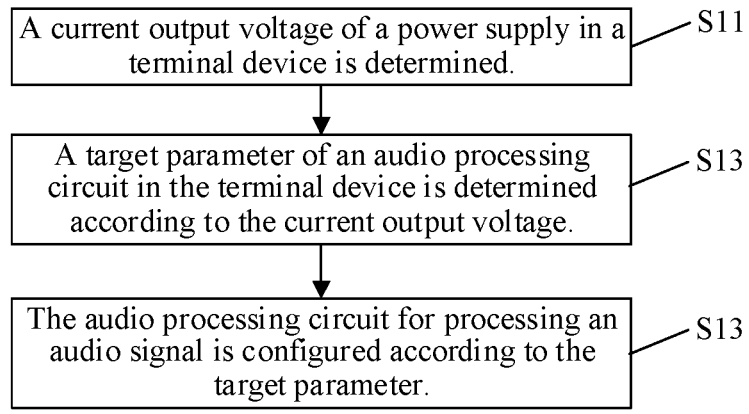
FIG. 1A is a flow chart of a method for processing information, according to an example of the present disclosure.

FIG. 1 is a first flow chart showing a method for processing information according to an embodiment of the present disclosure. As shown in FIG. 1, the method applied to a terminal device may include the following operations.

At S11, a current output voltage of a power supply in a terminal device is determined.

At S12, a target parameter of an audio processing circuit in the terminal device is determined according to the current output voltage.

At S13, an audio processing circuit for processing an audio signal is configured according to the target parameter.

The terminal device may be a wearable electronic device and a mobile terminal. The mobile terminal may include a mobile phone, a laptop and a tablet PC, and the wearable electronic device may include a smart watch, which are not limited in the embodiments of the present disclosure.

The power supply is a battery. The battery includes, but is not limited to, a lithium ion battery, a lead-acid battery or an alkaline battery.

After the current output voltage of the power supply is determined, the target parameter of the audio processing circuit in the terminal device may be determined according to the current output voltage, and the audio processing circuit is configured according to the target parameter.

In an embodiment, after the audio processing circuit is configured according to the target parameter, the method may further include an operation as follows. An audio signal is configured by the configured audio processing circuit.

In the embodiments of the present disclosure, the terminal device configures the audio processing circuit based on the target parameter which is determined according to the current output voltage of the power supply. When an audio signal is outputted by the terminal device, the configured audio processing circuit may be directly configured to process the audio signal to obtain the processed audio signal. In this way, an impact of a change of the output voltage of the power supply on the output volume of a loudspeaker can be reduced.

The audio signal is processed by the above configured audio processing circuit, and the processed audio signal is outputted through the loudspeaker of the terminal device.

The audio processing circuit includes, but is not limited to, a filter, a gainer, and a dynamic range controller or an amplifier.

The above processing on the audio signal may include but be not limited to filtering or gain processing on the audio signal, and the target parameter includes, but is not limited to, a filtering parameter or a gain parameter.

An output power of the loudspeaker varies with different power supply voltages of the audio processing circuit in the terminal device, which may result in a change of the output volume of the loudspeaker. The power supply voltage of the audio processing circuit is provided by the power supply. Therefore, a change of the output voltage of the power supply will results in a change of the output volume of the loudspeaker.

It is to be noted that either a change of a temperature or a change of power capacity of the power supply results in a change of an internal resistance of the power supply, and further affects the output voltage of the power supply. When the power supply is at a low temperature or low power capacity, the internal resistance of the power supply increases, further the output voltage of the power supply decreases, and the output volume of the loudspeaker reduces.

With taking a lithium ion battery as an example of the power supply, when the lithium ion battery is in a low-temperature environment or at low power capacity, the activity of anode and cathode materials decreases, and the conductivity of electrolyte also decreases, which results in an increase of the internal resistance of the lithium ion battery. The internal resistance of the battery includes ohmic internal resistance and polarization resistance. The ohmic internal resistance is composed of electrode materials, electrolyte, diaphragm resistance and contact resistances of various parts. Therefore, when the power supply is at low temperature or low power capacity, the ohmic internal resistance of the power supply increases.

Figure 2:
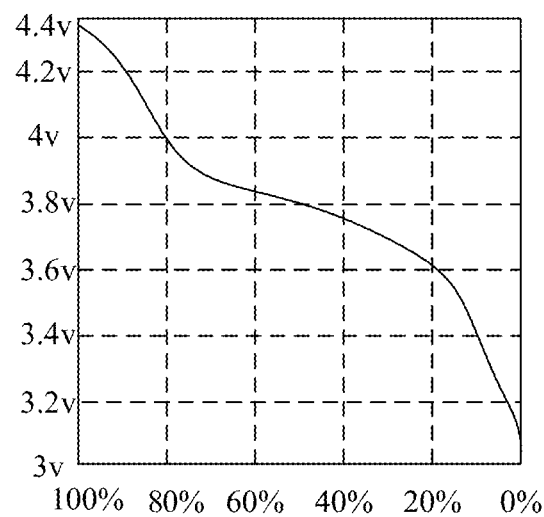
FIG. 2 is a schematic diagram of audio signal processing in a terminal device, according to an example of the present disclosure.

In this case, with the lithium ion battery generates a lot of joule heat in operation, the output voltage of the lithium ion battery decreases. FIG. 2 shows correspondences between the power capacity and the output voltages of the lithium ion battery. As the power capacity of the lithium ion battery decreases from 100% to 0, the output voltage of the lithium ion battery decreases from 4.4 to 3.

It can be seen that both the temperature and the power capacity of the power supply will affect the output voltage of the power supply, and further affect the output volume of the loudspeaker. For example, the output voltage of the power supply of the terminal device is stable at the room temperature, which will not result in a decrease of the output volume of the loudspeaker. When the temperature of the power supply changes to the low temperature from the room temperature, the output voltage of the power supply drops, which results in a decrease of the output volume of the loudspeaker. A temperature range corresponding to the room temperature includes, but is not limited to 0 degree to 50 degrees Celsius, and a temperature range corresponding to the low temperature may include a temperature lower than 0 degree Celsius.

In another example, when the power supply in the terminal device is at high power capacity, the output voltage of the power supply is stable, which does not affect the output volume of the loudspeaker. As the use time of the terminal device increases, the power capacity of the power supply in the terminal device changes from high power capacity to low power capacity, and the output voltage of the power supply decreases, and further the output volume of the loudspeaker decreases. The high power capacity of the power supply may correspondingly include a power capacity of the power supply, a ratio of which to the total power capacity is greater than 30%, and the low power capacity of the power supply may correspondingly include a power capacity of the power supply, a ratio of which to the total power is lower than 30%.

Based on this, in view of finding that the output volume of the loudspeaker decreases when the terminal device is in a scenario of low power capacity or low temperature, and analyzing that relationship between the output voltage of the power supply and the output volume of the loudspeaker, the embodiments of the present disclosure provide a target parameter of the audio processing circuit in the terminal device is determined based on a current output voltage, and an audio processing circuit for processing an audio signal is configured based on the target parameter. Therefore, the configured audio processing circuit can reduce the impact of the change of the temperature or the power capacity of the power supply on the output volume of the loudspeaker, and the output volume of the loudspeaker decreases at the low temperature or low power capacity, and that the output volume of the loudspeaker decreases due to a change of the output voltage of the power supply, thereby improving user experience. Also, the embodiments of the present disclosure are adaptable in scenarios of different temperatures and different powers, which expand the use scenarios of the terminal device.

In an embodiment, the method may further include an operation as follows.

A current temperature and/or a current power capacity of the power supply is detected.

The operation that the current output voltage of the power supply in the terminal device is determined may include an operation as follows. A current output voltage value of the power supply is determined according to the current temperature and/or the current power capacity of the power supply.

In the embodiments of the present disclosure, both the temperature and the power capacity of the power supply affect the output voltage of the power supply. For example, when an environment in which the terminal device is used changes, that is, the environment in which the terminal device is used changes to a low temperature environment from a room temperature environment, the output voltage of the power supply in the terminal device changes. In the use process of the terminal device, when the power capacity of the power supply changes from high power capacity to low power capacity, the output voltages of the power supply also changes.

Based on this, in a process of determining the current output voltage of the power supply, whether the output voltage of the power supply changes is determined by determining a change of a temperature of an environment which the terminal device is placed, that is, a change of the current temperature of the power supply, and whether the output voltage of the power supply changes is determined by determining a change of the current power of the terminal device, and whether the output voltage of the power supply changes is determined by a change of the current power and a change of the current temperature of the power supply.

In another embodiment, the operation that the current output voltage of the power supply is determined may include an operation as follows. The current output voltage value of the power supply is determined according to the current temperature of the power supply. Alternatively, the current output voltage value of the power supply is determined according to the current power capacity of the power supply. Alternatively, the current output voltage value of the power supply is determined according to the current power capacity and the current temperature of the power supply.

It is to be noted that the current temperature and/or the current power capacity of the power supply may be detected by a detecting module disposed on the terminal device. The detecting module includes, but is not limited to, a temperature sensor, a thermistor or a voltameter.

In another embodiment, the operation that the current temperature of the power supply is detected may include an operation as follows. The current temperature of the power supply is detected by means of the thermistor disposed adjacent to the power supply.

A resistance value of the thermistor can change as the temperature. The thermistor includes a positive temperature coefficient thermistor and a negative temperature coefficient thermistor. The resistance value of the positive temperature coefficient thermistor increases as the temperature increases, and the resistance value of the negative temperature coefficient thermistor decreases as the temperature increases. Therefore, the resistance value of the thermistor can reflect the temperature of the power supply adjacent thereto, and the current temperature of the power supply is determined by determining the resistance value of the thermistor.

In another embodiment, the operation that the current power capacity of the power supply is detected may include an operation as follows. The current power capacity of the power supply is determined by means of the voltameter serially connected in a power supply circuit of the power supply.

In the embodiments of the present disclosure, the voltameter detects a current in the power supply circuit per unit time to determine a current difference in the power supply circuit, and then integrates the current difference, to calculate the power capacity of the power supply.

Figure 1B:
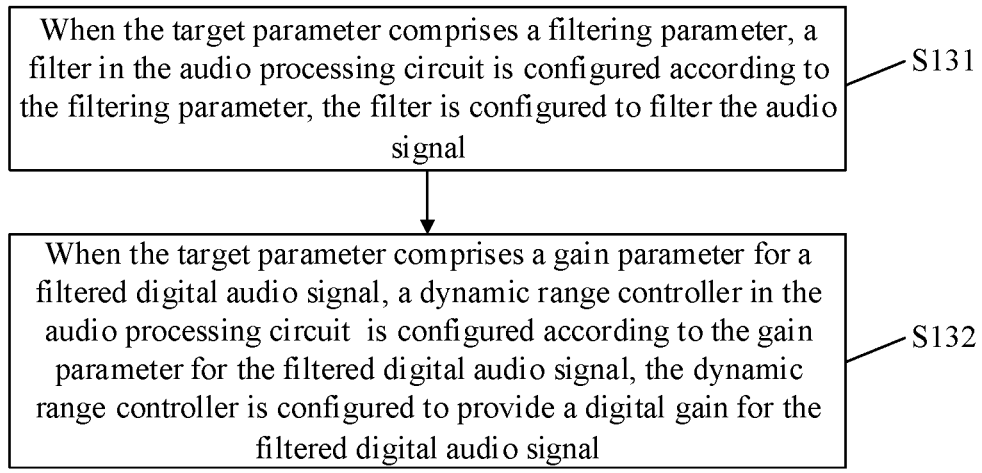
FIG. 1B is a flowchart of configuring an audio processing circuit for processing an audio signal according to a target parameter according to an example of the present disclosure.

In an embodiment, as shown in FIG. 1B which is a flowchart of configuring an audio processing circuit for processing an audio signal according to a target parameter according to an embodiment, the operation that the audio processing circuit for processing the audio signal is configured according to the target parameter may include at least one of the following operations.

At operation S131, in response to the target parameter includes a filtering parameter, a filter in the audio processing circuit is configured according to the filtering parameter. The filter is configured to filter the audio signal.

At operation S132, in response to the target parameter includes a gain parameter for a digital audio signal, a dynamic range controller in the audio processing circuit is configured according to the gain parameter for the digital audio signal. The dynamic range controller is configured to provide a digital gain on the filtered audio signal.

In response to the target parameter includes a gain parameter for an analog audio signal, an amplifier in the audio processing circuit is configured according to the gain parameter for the analog audio signal. The amplifier is configured to amplify the audio signal which is converted into an analog signal.

In the embodiments of the present disclosure, the target parameter includes the filtering parameter, the gain parameter for the digital audio signal and the gain parameter for the analog audio signal. At least one device included in the audio processing circuit may be configured through the target parameter. Bases on this, the audio signal is processed by the configured audio processing circuit, the output volume of the loudspeaker decreases due to the change of the current temperature and the current power capacity of the power supply, and improving user experience.

Figure 3:
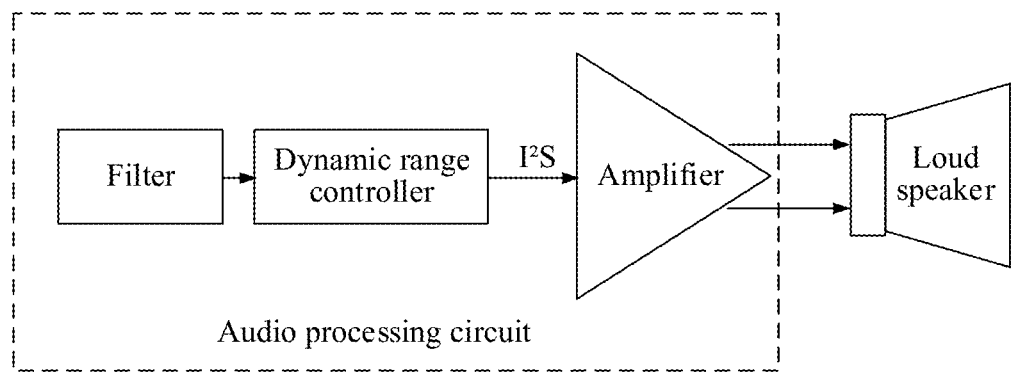
FIG. 3 is a schematic diagram of processing an audio signal by an amplifier in a terminal device, according to an example of the present disclosure.

As shown in FIG. 3, the filter is connected to the dynamic range controller, the dynamic range controller is connected to the amplifier, and the amplifier is connected to the loudspeaker. The gain or the power of the amplifier is a gain adjustable amplifier and a power adjustable amplifier.

In processing an audio signal, the filter processes a digital audio signal, and the filtered audio signal is outputted to the dynamic range controller, the dynamic range controller performs digital gain processing on the filtered audio signal, and the audio signal obtained after the digital gain processing is outputted to the amplifier through Inter-IC Sound ($I^2S$) of an audio input interface, and the audio signal is outputted through the loudspeaker.

Figure 4:
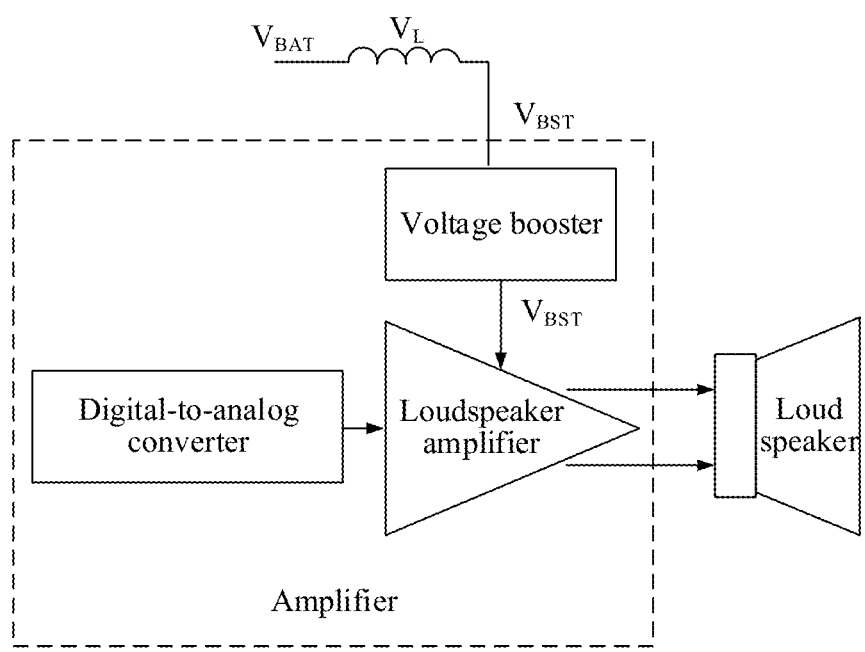
FIG. 4 is a schematic diagram of performing a method for processing information by a terminal device, according to an example of the present disclosure.

As shown in FIG. 4, the amplifier includes a digital-to-analog converter, a loudspeaker amplifier and a voltage booster. The voltage booster is connected to an output end of the power supply through an inductor. VBAT represents an output voltage of the power supply, VL represents a discharge voltage of the inductor, and VB ST represents an output voltage of the voltage booster. The sum of the output voltage of the power supply and the discharge voltage of the inductor is equal to the output voltage of the voltage booster. It can be seen that a change of the output voltage of the power supply will affect the output voltage of the voltage booster, and further affect the output volume of the loudspeaker.

A digital signal is outputted after the dynamic range controller processes the filtered audio signal. It is necessary to convert the digital signal into an analog signal by means of the digital-to-analog converter. The loudspeaker amplifier amplifies the audio signal converted into the analog signal. The voltage booster drives the loudspeaker to output the amplified to-be-outputted signal with high power.

In the embodiments of the present disclosure, a gain value obtained for the audio signal corresponding to the output voltage value greater than an output voltage threshold is less than a gain value obtained for the audio signal corresponding to the output voltage value less than the output voltage threshold.

In an embodiment, the filtering parameter includes: a first filtering parameter corresponding to the output voltage value greater than the output voltage threshold, and a second filtering parameter corresponding to the output voltage value less than or equal to the output voltage threshold. After the audio processing circuit processes the audio signal based on the first filtering parameter, a first gain value for the audio signal is obtained. After the audio processing circuit processes the audio signal based on the second filtering parameter, a second gain value for the audio signal is obtained. The second gain value is greater than the first gain value.

Alternatively, the gain parameter for the digital audio signal includes a first gain parameter corresponding to the output voltage value greater than the output voltage threshold, and a second gain parameter corresponding to the output voltage value less than or equal to the output voltage threshold. After the audio processing circuit processes the audio signal based on the first gain parameter, a third gain value for the audio signal is obtained. After the audio processing circuit processes the audio signal based on the second gain parameter, a fourth gain value for the audio signal is obtained. The fourth gain value is greater than the third gain value.

Alternatively, the gain parameter for the analog audio signal includes: a third gain parameter corresponding to the output voltage value greater than the output voltage threshold, and a fourth gain parameter corresponding to the output voltage value less than or equal to the output voltage threshold. After the audio processing circuit processes the audio signal based on the third gain parameter, a fifth gain value for the audio signal is obtained. After the audio processing circuit processes the audio signal based on the fourth gain parameter, a sixth gain value for the audio signal is obtained. The sixth gain value is greater than the fifth gain value.

In the embodiments of the present disclosure, the change of output voltage of the power supply will affect the output volume of the loudspeaker. For different output voltages, different parameters corresponding to the output voltages are determined, so that various devices in the audio processing circuit can perform different processing on the audio signal based on the different parameters to compensate the change of volume of the loudspeaker caused by the change of the output voltage.

It is to be noted that as compared to the output volume of the loudspeaker when the output voltage value of the power supply is greater than the output voltage threshold, the output volume of the loudspeaker when the output voltage value of the power supply is less than the output voltage threshold drops significantly. Therefore, two parameters may be set correspondingly for two output voltage ranges. When the current output voltage value of the power supply is less than the output voltage threshold, the filter is configured by using the second filtering parameter, the dynamic range controller is configured by using the second gain parameter, and the amplifier is configured by using the fourth gain parameter, which facilitates processing the audio signal by the configured audio processing circuit, thereby reducing the situation that the volume of the loudspeaker decreases due to the change of output voltage.

In the process of determining the target parameter, the audio signal may be compensated by increasing a gain value, to reduce an obvious difference of the output volume of the loudspeaker. It is to be noted that an operation that the gain value for the audio signal is obtained by the audio processing circuit includes an operation that a gain value corresponding to the volume of the audio signal is increased by configuring the audio processing circuit. For example, when the audio processing circuit is the amplifier, the volume of the audio signal in the analog signal may be increased. When the audio processing circuit is the dynamic range controller, the volume of the audio signal in the digital signal may be increased.

In the embodiments of the present disclosure, a first gain value and a second value may be set according to actual needs. For example, when the first gain value is 0 or 1, the second gain value may be set as 8 or 10, which are not limited in the embodiments of the present disclosure.

In an embodiment, the operation that the filter in the audio processing circuit is configured according to the filtering parameter may include an operation as follows.

A filtering parameter of a predetermined frequency sub-band in a first filtering frequency band of the filter is configured according to the filtering parameter, to enable the audio signal of the predetermined frequency sub-band to pass. A frequency of the predetermined frequency sub-band ranges 2 KHz to 4 KHz.

In the embodiments of the present disclosure, the frequency of the predetermined frequency sub-band ranges 2 KHz to 4 KHz. The frequency of the predetermined frequency sub-band corresponds to a frequency band which is most sensitive to the human ear. Therefore, by adjusting an amplitude of the frequency band according to the filtering parameter, users' perception for the decrease of output volume corresponding to the audio signal in the frequency band can be reduced on one hand, adjusting time may be saved and further adjusting efficiency may be improved as compared with adjusting the whole frequency band of the audio signal on the other hand.

Figure 5:
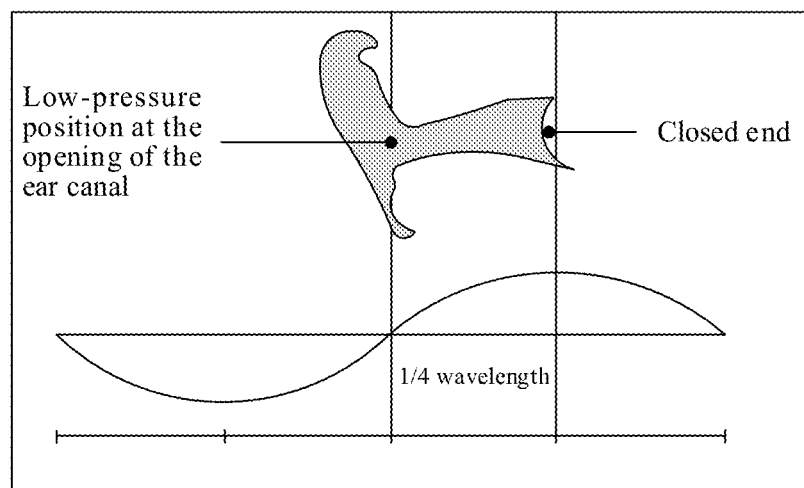
FIG. 5 is a schematic diagram of a device for processing information, according to an example of the present disclosure.

As shown in FIG. 5, a distance between a low-pressure position at the opening of an ear canal and a closed end (a high-pressure position at an eardrum) is the length of the ear canal. It is assumed that the length L of the ear canal is 2.5 cm, L is ¼ of the wavelength of an acoustic wave in the air, and a speed v at which sound travels in the air is equal to 340 m/s. In this case, the wavelength $\lambda$ of the acoustic wave is represented as $\lambda=4$ L=4×2.5 cm=10 cm, and a sound frequency f is represented as f=v/$\lambda$=340 m/s/0.1 m=3400 Hz. It is can be seen that a most sensitive frequency point for listening of the human ear is 3400 Hz. Because there is a different for ear canals of different people, a frequency band ranging from 2 KHz to 4 KHz may be taken as an adjustment and improvement part, so as to increase the volume in the frequency band ranging from 2 KHz to 4 KHz.

In an embodiment, the operation that the target parameter of the audio processing circuit in the terminal device is determined according to the current output voltage may include an operation as follows. The target parameter of the audio processing circuit in the terminal device is obtained by looking up the pre-established correspondences between the output voltage ranges of the power supply and the target parameters.

It is to be noted that the target parameter is used for configuring the audio processing circuit for processing the audio signal. Therefore, in the process of establishing the correspondences between the output voltage ranges and the target parameters, the correspondences may be established according to the devices included in the audio processing circuit.

For example, when the audio processing circuit includes the filter, the dynamic range controller and the amplifier, and the correspondingly target parameter includes the filtering parameter, the gain parameter for the digital audio signal and the gain parameter for the analog audio signal, correspondences between the voltage ranges and the filtering parameters, the gain parameters for the digital audio signal and the gain parameters for the analog audio signal in the target parameter may be established. In this way, after the current output voltage is determined, the target parameter corresponding to the device may be found directly.

It is to be noted that the embodiments of the present disclosure are not limited to determining the target parameter by looking up the pre-established correspondences of the various devices in the audio processing circuit, the target parameter may also be obtained based on function calculation, which are not limited by the embodiments of the present disclosure.

It is understandable that by looking up the pre-established correspondences of the various devices in the audio processing circuit, the target parameters corresponding to different devices may be found based on the correspondences when the output voltage changes, which facilitates the subsequent configuration processing.

Figure 6:
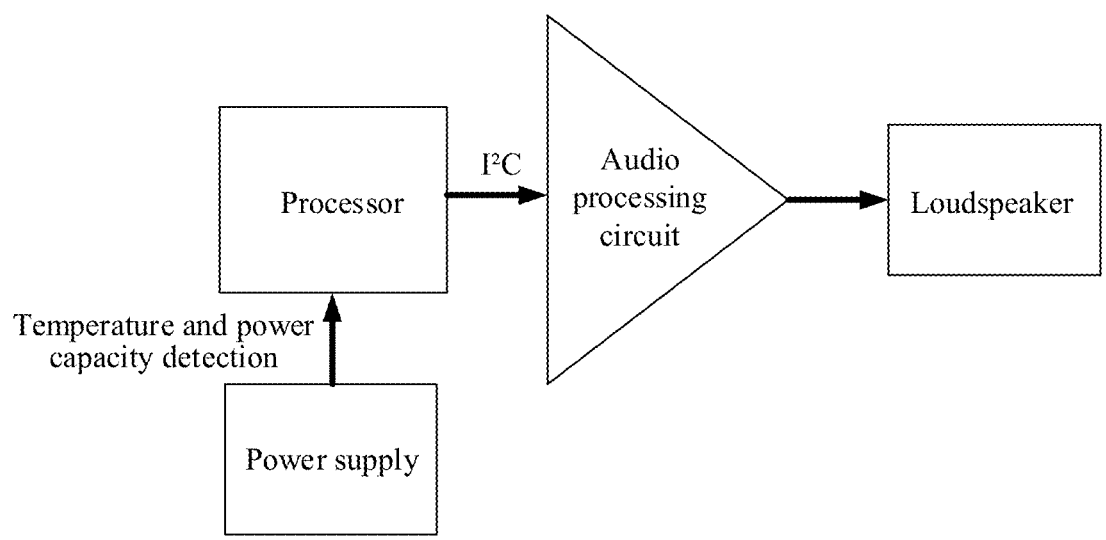
FIG. 6 is a structural block diagram of a terminal device, according to an example of the present disclosure.

As shown in FIG. 6, the terminal device includes the power supply, a processor, the audio processing circuit and the loudspeaker. The processor is connected to the power supply. The processor outputs a control instruction to the audio processing circuit by controlling an Inter-Integrated Circuit (I²C) bus. The loudspeaker outputs the audio signal processed by the audio processing circuit. In a process of outputting the audio signal, the output voltage of the power supply is determined, and then the target parameter of the audio processing circuit in the terminal device is obtained by looking up the pre-established correspondences between the output voltage ranges and the target parameters. In this case, the processor controls the audio processing circuit to configure the target parameter, and the configured audio processing circuit processes the audio signal. In such a manner, by monitoring the output voltage of the power supply in real time, a situation that the output volume of the loudspeaker decreases due to the change of output voltage of the power supply can be reduced, thereby improving user experience.

Figure 7:
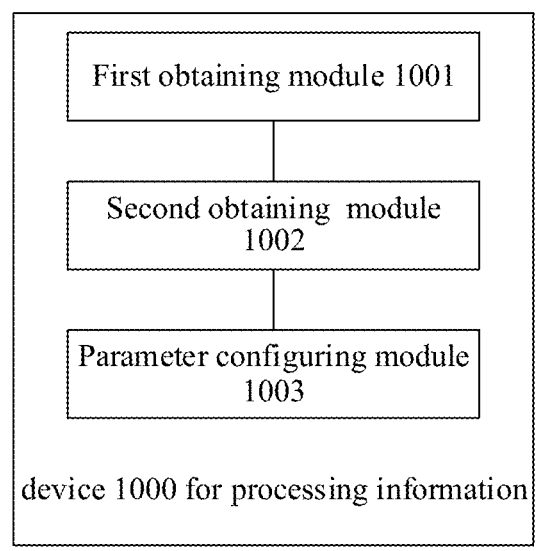
FIG. 7 is a schematic diagram of a device for processing information according to an example of the present disclosure.

FIG. 7 is a schematic diagram of a device for processing information according to an embodiment. Referring to FIG. 7, the device 1000 for processing information includes a first obtaining module 1001, a second obtaining module 1002, and a parameter configuring module 1003.

The first obtaining module 1001 is configured to determine a current output voltage of the power supply in the terminal device.

The second obtaining module 1002 is configured to determine a target parameter of an audio processing circuit in the terminal device according to the current output voltage.

The parameter configuring module 1003 is configured to configure the audio processing circuit for processing an audio signal according to the target parameter.

In an embodiment, a detecting module is configured to detect a current temperature and/or a current power capacity of the power supply.

The first obtaining module is configured to detect the current temperature and/or the current power capacity of the power supply in the terminal device, and determine a current output voltage value of the power supply based on the current temperature and/or the current power capacity.

In an embodiment, the parameter configuring module 1003 may include at least one of a first configuring module, a second configuring module and a third configuring module.

The first configuring module is configured to configure, in response to the target parameter includes a filtering parameter, a filter in the audio processing circuit according to the filtering parameter. The filter is configured to filter the audio signal.

The second configuring module is configured to configure, in response to the target parameter includes a gain parameter for a digital audio signal, a dynamic range controller in the audio processing circuit according to the gain parameter for the digital audio signal. The dynamic range controller is configured to provide a digital gain on the filtered audio signal.

The third configuring module is configured to configure, in response to the target parameter includes a gain parameter for an analog audio signal, an amplifier in the audio processing circuit according to the gain parameter for the analog audio signal. The amplifier is configured to amplify the audio signal which is converted into an analog signal.

In an embodiment, the filtering parameter includes: a first filtering parameter corresponding to the output voltage value greater than the output voltage threshold, and a second filtering parameter corresponding to the output voltage value less than or equal to the output voltage threshold. The audio processing circuit processes the audio signal based on the first filtering parameter, such that a first gain value for the audio signal is obtained. The audio processing circuit processes the audio signal based on the second filtering parameter, such that a second gain value for the audio signal is obtained. The second gain value is greater than the first gain value.

Alternatively, the gain parameter for the digital audio signal includes a first gain parameter corresponding to the output voltage value greater than the output voltage threshold, and a second gain parameter corresponding to the output voltage value less than or equal to the output voltage threshold. The audio processing circuit processes the audio signal based on the first gain parameter, such that a third gain value for the audio signal is obtained. The audio processing circuit processes the audio signal based on the second gain parameter, such that a fourth gain value for the audio signal is obtained. The fourth gain value is greater than the third gain value.

Alternatively, the gain parameter for the analog audio signal includes: a third gain parameter corresponding to the output voltage value greater than the output voltage threshold, and a fourth gain parameter corresponding to the output voltage value less than or equal to the output voltage threshold. The audio processing circuit processes the audio signal based on the third gain parameter, such that a fifth gain value for the audio signal is obtained. The audio processing circuit processes the audio signal based on the fourth gain parameter, such that a sixth gain value for the audio signal is obtained. The sixth gain value is greater than the fifth gain value.

In an embodiment, the first configuring module is configured to configure a filtering parameter of a predetermined frequency sub-band in a first filtering frequency band of the filter according to the filtering parameter, to enable a audio signal of the predetermined frequency sub-band to pass. A frequency of the predetermined frequency sub-band ranges from 2 KHz to 4 KHz.

In an embodiment, the second obtaining module 1002 is configured to obtain the target parameter of the audio processing circuit in the terminal device by looking up the pre-established correspondences between the output voltage ranges of the power supply and the target parameters.

Regarding the device in the above embodiments, the specific modes of performing operations by various modules have been described in detail in the embodiments for the method, which are not be repeated here anymore.

Figure 8:
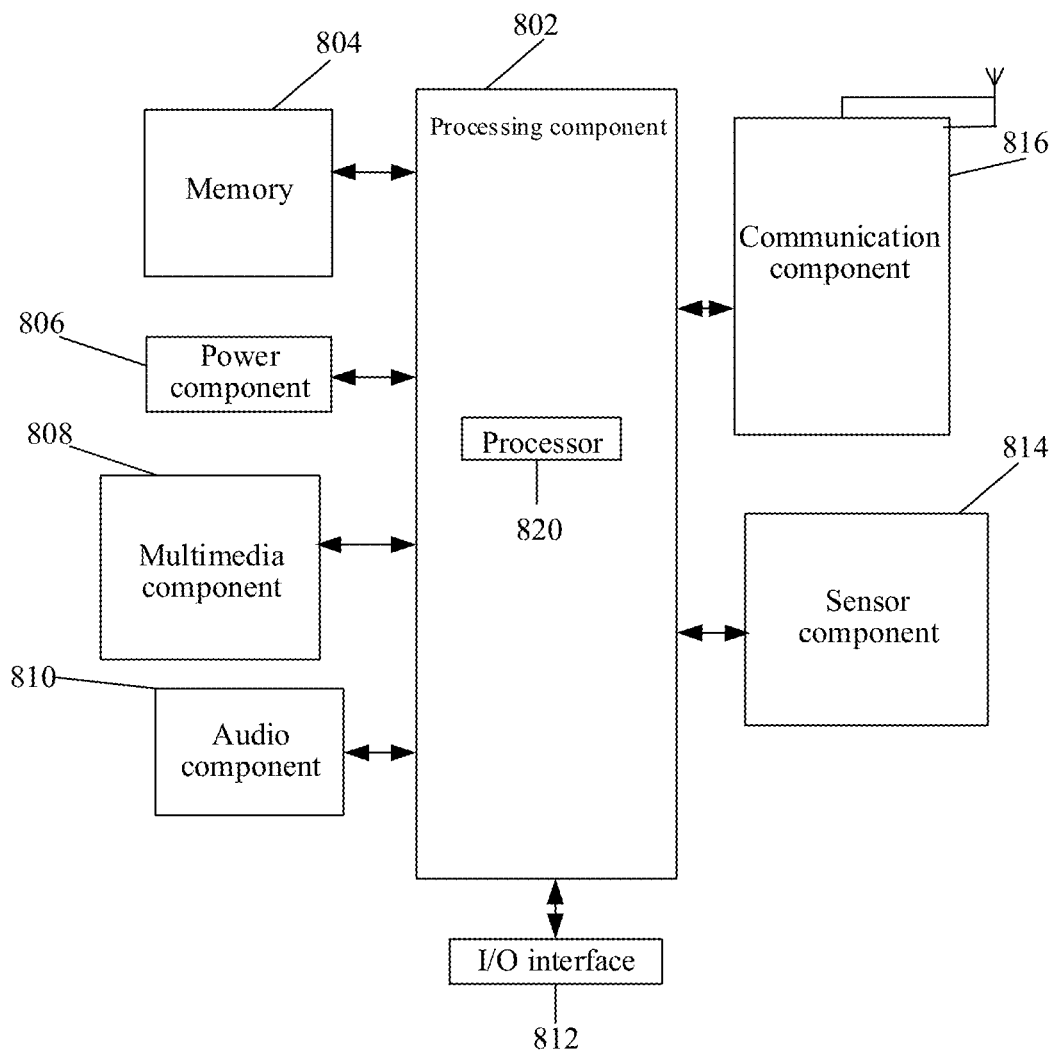
FIG. 8 is a structure block diagram of a terminal device according to an example of the present disclosure.

FIG. 8 is a structure block diagram of a terminal device, according to an embodiment. For example, the terminal device may be a mobile phone, a mobile computer, and so on.

Referring to FIG. 8, the terminal device may include one or more of the following components: a processing component 802, a memory 804, a power component 806, a multimedia component 808, an audio component 810, an Input/Output (I/O) interface 812, a sensor component 814, and a communication component 816.

The processing component 802 is typically configured to control overall operations of the terminal device, such as the operations associated with display, telephone calls, data communications, camera operations, and recording operations. The processing component 802 may include one or more processors 820 to execute instructions to perform all or part of the operations in the abovementioned method. Moreover, the processing component 802 may include one or more modules which facilitate interaction between the processing component 802 and other components. For instance, the processing component 802 may include a multimedia module to facilitate interaction between the multimedia component 808 and the processing component 802.

The memory 804 is configured to store various types of data to support the operation of the device. Examples of such data include instructions for any application programs or methods operated on the device, contact data, phonebook data, messages, pictures, video, etc. The memory 804 may be implemented by any type of volatile or non-volatile memory devices, or a combination thereof, such as a Static Random Access Memory (SRAM), an Electrically Erasable Programmable Read-Only Memory (EEPROM), an Erasable Programmable Read-Only Memory (EPROM), a Programmable Read-Only Memory (PROM), a Read-Only Memory (ROM), a magnetic memory, a flash memory, and a magnetic or optical disk.

The power component 806 is configured to provide power for various components of the device. The power component 806 may include a power management system, one or more power supplies, and other components associated with generation, management and distribution of power for the device.

The multimedia component 808 may include a screen for providing an output interface between the terminal device and a user. In some examples, the screen may include a Liquid Crystal Display (LCD) and a Touch Panel (TP). If the screen includes the TP, the screen may be implemented as a touch screen to receive an input signal from the user. The TP includes one or more touch sensors to sense touches, swipes and gestures on the TP. The touch sensors may not only sense a boundary of a touch or swipe action but also detect a duration and pressure associated with the touch or swipe action. In some examples, the multimedia component 808 may include a front camera and/or a rear camera. The front camera and/or the rear camera may receive external multimedia data when the device is in an operation mode, such as a photographing mode or a video mode. Each of the front camera and the rear camera may be a fixed optical lens system or have focusing and optical zooming capabilities.

The audio component 810 is configured to output and/or input an audio signal. For example, the audio component 810 includes a Microphone (MIC), and the MIC is configured to receive an external audio signal when the terminal is in the operation mode, such as a call mode, a recording mode and a voice recognition mode. The received audio signal may further be stored in the memory 804 or transmitted through the communication component 816. In some examples, the audio component 810 may further include a speaker configured to output the audio signal.

The I/O interface 812 is configured to provide an interface between the processing component 802 and a peripheral interface module, and the peripheral interface module may be a keyboard, a click wheel, a button and the like. The button may include, but not limited to: a home button, a volume button, a starting button and a locking button.

The sensor component 814 may include one or more sensors configured to provide status assessment in various aspects for the device. For instance, the sensor component 814 may detect an on/off status of the device and relative positioning of components, such as a display and small keyboard of the device, and the sensor component 814 may further detect a change in a position of the device or a component of the terminal, presence or absence of contact between the user and the device, orientation or acceleration/deceleration of the device and a change in temperature of the device. The sensor component 814 may include a proximity sensor configured to detect presence of an object nearby without any physical contact. The sensor component 814 may also include a light sensor, such as a Complementary Metal Oxide Semiconductor (CMOS) or Charge Coupled Device (CCD) image sensor, configured for use in an imaging APP. In some examples, the sensor component 814 may also include an acceleration sensor, a gyroscope sensor, a magnetic sensor, a pressure sensor or a temperature sensor.

The communication component 816 is configured to facilitate wired or wireless communication between the device and other equipment. The device may access a communication-standard-based wireless network, such as a Wireless Fidelity (Wi-Fi) network, a 2nd-Generation (2G), 3rd-Generation (3G), 4th-Generation (4G), or 5th-Generation (5G) network or a combination thereof. In some embodiments of the present disclosure, the communication component 816 is configured to receive a broadcast signal or broadcast associated information from an external broadcast management system through a broadcast channel. In some embodiments of the present disclosure, the communication component 816 may further include a Near Field Communication (NFC) module to facilitate short-range communication. For example, the NFC module may be implemented based on a Radio Frequency Identification (RFID) technology, an Infrared Data Association (IrDA) technology, an Ultra-WideBand (UWB) technology, a Bluetooth (BT) technology and another technology.

In some embodiments of the present disclosure, the device may be implemented by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), controllers, micro-controllers, microprocessors or other electronic components, and is configured to execute the abovementioned method.

In some embodiments of the present disclosure, a non-transitory computer-readable storage medium including an instruction is further provided, such as the memory 804 including an instruction, and the instruction may be executed by the processor 820 of the device to implement the abovementioned method. For example, the non-transitory computer-readable storage medium may be a ROM, a random access memory (RAM), a Compact Disc Read-Only Memory (CD-ROM), a magnetic tape, a floppy disc, an optical data storage device and the like.

A non-transitory computer-readable storage medium is provided. When an instruction in the storage medium is executed by the processor of the terminal device, the terminal device can execute the method for processing information. The method may include operations as follows.

A current temperature and/or a current power capacity of the power supply in the terminal device is determined.

A target parameter of the audio processing circuit in the terminal device are determined according to the current temperature and/or the current power capacity; and An audio processing circuit for processing the audio signal is configured according to the target parameter.

Other implementations of the present disclosure will be apparent to those skilled in the art from consideration of the specification and practice of the present disclosure. This present application is intended to cover any variations, uses, or adaptations of the present disclosure conforming to the general principles thereof and including such departures from the present disclosure as come within known or customary practice in the art. The specification and embodiments are examples, and a true scope and spirit of the present disclosure are indicated by the following claims.

It will be appreciated that the present disclosure is not limited to the exact construction that has been described above and illustrated in the accompanying drawings, and that various modifications and changes may be made without departing from the scope of the present disclosure. It is intended that the scope of the present disclosure is only limited by the appended claims.

What is claimed is:

1. A method for processing information, comprising:
   determining a current output voltage of a power supply in a terminal device;
   determining a target parameter of an audio processing circuit in the terminal device according to the current output voltage; and
   configuring the audio processing circuit for processing an audio signal according to the target parameter, wherein the method further comprises:
   detecting a current temperature of the power supply,
   wherein determining the current output voltage of the power supply in the terminal device comprises:
   determining the current output voltage value of the power supply according to the current temperature,
   wherein configuring the audio processing circuit for processing the audio signal according to the target parameter comprises: when the target parameter comprises a gain parameter for a filtered digital audio signal, configuring a dynamic range controller in the audio processing circuit according to the gain parameter for the filtered digital audio signal, with the dynamic range controller being configured to provide a digital gain for the filtered digital audio signal, and
   the gain parameter for the filtered digital audio signal comprises a first gain parameter corresponding to the output voltage value greater than the output voltage threshold, and a second gain parameter corresponding to the output voltage value less than or equal to the output voltage threshold, wherein the audio processing circuit processes the audio signal based on the first gain parameter, such that a third gain value for the audio signal is obtained, and the audio processing circuit processes the audio signal based on the second gain parameter, such that a fourth gain value for the audio signal is obtained, the fourth gain value is greater than the third gain value.

2. The method of claim 1, wherein determining the target parameter of the audio processing circuit in the terminal device according to the current output voltage comprises:
   obtaining the target parameter of the audio processing circuit in the terminal device by looking up pre-established correspondences between output voltage ranges of the power supply and the target parameters.

3. A terminal device, comprising:
   one or more processors; and
   a non-transitory computer-readable storage medium configured to store a processor-executable instruction;
   wherein, the one or more processors are configured to:
   determine a current output voltage of a power supply in a terminal device;
   determine a target parameter of an audio processing circuit in the terminal device according to the current output voltage;
   configure the audio processing circuit for processing an audio signal according to the target parameter; and
   detect a current temperature of the power supply, and determine the current output voltage value of the power supply according to the current temperature,
   wherein the one or more processors are further configured to: when the target parameter comprises a gain parameter for a filtered digital audio signal, configure a dynamic range controller in the audio processing circuit according to the gain parameter for the filtered digital audio signal, with the dynamic range controller being configured to provide a digital gain for the filtered digital audio signal, and
   the gain parameter for the filtered digital audio signal comprises a first gain parameter corresponding to the output voltage value greater than the output voltage threshold, and a second gain parameter corresponding to the output voltage value less than or equal to the output voltage threshold, wherein the one or more processors process the audio signal based on the first gain parameter, such that a third gain value for the audio signal is obtained, and the one or more processors process the audio signal based on the second gain parameter, such that a fourth gain value for the audio signal is obtained, the fourth gain value is greater than the third gain value.

4. The terminal device of claim 3, wherein the one or more processors are further configured to:
   obtain the target parameter of the audio processing circuit in the terminal device by looking up pre-established correspondences between output voltage ranges of the power supply and the target parameters.

5. A non-transitory computer-readable storage medium, wherein an instruction in the storage medium, when being executed by one or more processors of a terminal, enables the terminal to perform a method for processing information, the method comprising:
  determining a current output voltage of a power supply in a terminal device;
  determining a target parameter of an audio processing circuit in the terminal device according to the current output voltage; and
  configuring the audio processing circuit for processing an audio signal according to the target parameter, wherein the method further comprises:
  detecting a current temperature of the power supply,
  wherein determining the current output voltage of the power supply in the terminal device comprises:
  determining the current output voltage value of the power supply according to the current temperature,
  wherein configuring the audio processing circuit for processing the audio signal according to the target parameter comprises: when the target parameter comprises a gain parameter for a filtered digital audio signal, configuring a dynamic range controller in the audio processing circuit according to the gain parameter for the filtered digital audio signal, with the dynamic range controller being configured to provide a digital gain for the filtered digital audio signal, and
  the gain parameter for the filtered digital audio signal comprises a first gain parameter corresponding to the output voltage value greater than the output voltage threshold, and a second gain parameter corresponding to the output voltage value less than or equal to the output voltage threshold, wherein the audio processing circuit processes the audio signal based on the first gain parameter, such that a third gain value for the audio signal is obtained, and the audio processing circuit processes the audio signal based on the second gain parameter, such that a fourth gain value for the audio signal is obtained, the fourth gain value is greater than the third gain value.

* * * * *